United States Patent [19]

De Vita et al.

[11] 3,789,483

[45] Feb. 5, 1974

[54] APPARATUS FOR FEEDING PRINTED CIRCUIT BOARDS

[75] Inventors: Raymond A. De Vita, Hamilton; Vincent P. Romeo, Danvers; James E. Carney, Methuen, all of Mass.

[73] Assignee: USM Corporation, Boston, Mass.

[22] Filed: Aug. 28, 1972

[21] Appl. No.: 284,280

[52] U.S. Cl. .......... 29/203 B

[51] Int. Cl. .......... H05k 13/04

[58] Field of Search .......... 29/203 B, 203 D, 203 R

[56] References Cited

UNITED STATES PATENTS

| | | | |
|---|---|---|---|
| 2,772,416 | 12/1956 | Dorosz et al. | 29/203 B |
| 2,908,010 | 10/1959 | Lord et al. | 29/203 B |
| 3,641,651 | 2/1972 | Rockwell, Jr. | 29/203 B |

*Primary Examiner*—Thomas H. Eager

*Attorney, Agent, or Firm*—Carl E. Johnson; Richard B. Megley; Vincent A. White

[57] ABSTRACT

Assembly apparatus including mechanism for automatically supplying work pieces such as printed circuit boards sequentially to one or more work stations from a stack and for thereafter unloading the boards seriatim whereby only a single operator is required. The mechanism may be a vertically movable, free-standing turntable or turret type for simultaneously serving a selected one or more stations, operation of any one of the stations desirably controlling the turret indexing whereby the several stations operate simultaneously. The mechanism is adapted to service at least one work station optionally including an X-Y positioning table whereat successive boards during dwell times may be shifted to programmed component receiving positions prior to return to the turret feeding mechanism.

6 Claims, 13 Drawing Figures

APPARATUS FOR FEEDING PRINTED CIRCUIT BOARDS

BACKGROUND OF THE INVENTION

This invention relates to an automatic mechanism for assembling work pieces in predetermined relation on base members.

More especially the invention is directed to means for precisely mounting electronic components (including integrated circuit component units consisting of interconnected microminiature circuit elements) in the printed circuits carried by circuit boards.

In prior art approaches to the matter of mounting a plurality of different electronic components, for instance, as disclosed in U.S. Pat. No. 2,772,416 — Dorosz et al., and U.S. Pat. No. 2,908,010 — Lord et al., the circuit boards are fed successively to and through a series of work stations respectively having an inserting head for mounting a particular type and value of electronic component. As many as 50 or more in-line stations may be employed to assemble substantially all the required discrete components, each in its uniformly proper position on the respective boards. An alternate arrangement employing manually loaded board holding stations and template controlled work positioning means is disclosed, for instance, in U.S. letters Pat. No. 3,641,651. Such systems normally operate with high reliability assuming consistently high quality and regularity in the shapes and dimensions of the work pieces.

With the advent of component modules, i.e. integrated circuit units, and improved non-variance in printed circuit boards, as well as introduction into the industry of X-Y board positioning by suitable programming means or otherwise, a new order of capability and versatility in automatic assembly is possible. A compact machine arrangement requiring fewer operating stations, fewer attendants, and retaining a high or higher degree of reliability in modules and board assembly becomes the goal.

SUMMARY OF THE INVENTION

In view of the foregoing it is a main object of this invention to provide, for use with assembly apparatus having one or more operating stations, an automatic work loading, positioning, and unloading mechanism for synchronously serving the stations.

Another and more specific object of this invention is to provide a compact, versatile machine for feeding printed circuit boards or substrates from a stack for assembly with electronic compoents in predetermined manner.

Yet another object of the invention is to provide a carousel type of conveyor for loading and unloading successive circuit boards with respect to a programmable inserter that is also adapted to control indexing of the carrousel.

In accordance with these objects, and as herein shown, a feature of the invention resides in provision of a rotatively indexable work holder operable between a work loading station and a work unloading station, the work holder also being mounted for heightwise movement relative to the stations, mechanism for indexing the work holder to cause it to deliver a work piece at an operating station intermediate the loading and delivery stations while respectively loading and unloading at the latter, the work holder including a plurality of cooperative grippers, and means spaced to correspond with the spacing of the respective stations for moving the work holder heightwise thereat to cause the grippers sequentially to release and lock onto the respective work pieces.

In the illustrative embodiment a stepping motor or standard rotary indexer preferably including braking means is programmed, in the case of a single operating station, for 120° indexing. The arrangment accordingly is such, as herein shown, that a rotary spider is provided with three pairs of board-receiving grippers spaced 120° apart, each pair being operable at a station to be closed on a board in spider-up position and opened to release or receive the board in response to relative downward movement of the spider. Thus, for example, the spider is in its down position during simultaneous board loading, component insertion, and board unloading; and the spider is shifted to its up position and board gripping prior to being indexed to the next station and repeat cycling.

It will be understood that four stations and 90° indexing, or additional operations may readily be programmed as desired. Preferably, and as herein illustrated the automatic circuit board feeder is a free-standing machine to be associated with independently operable work stations as desired.

BRIEF DESCRIPTION OF THE DRAWINGS

The foregoing and other features of the invention together with novel details will now be more particularly described in connection with component assembly apparatus including an automatic circuit board feeder and with reference to the accompanying drawings thereof, in which.

DESCRIPTION OF PREFERRED EMBODIMENT

Figure 1:
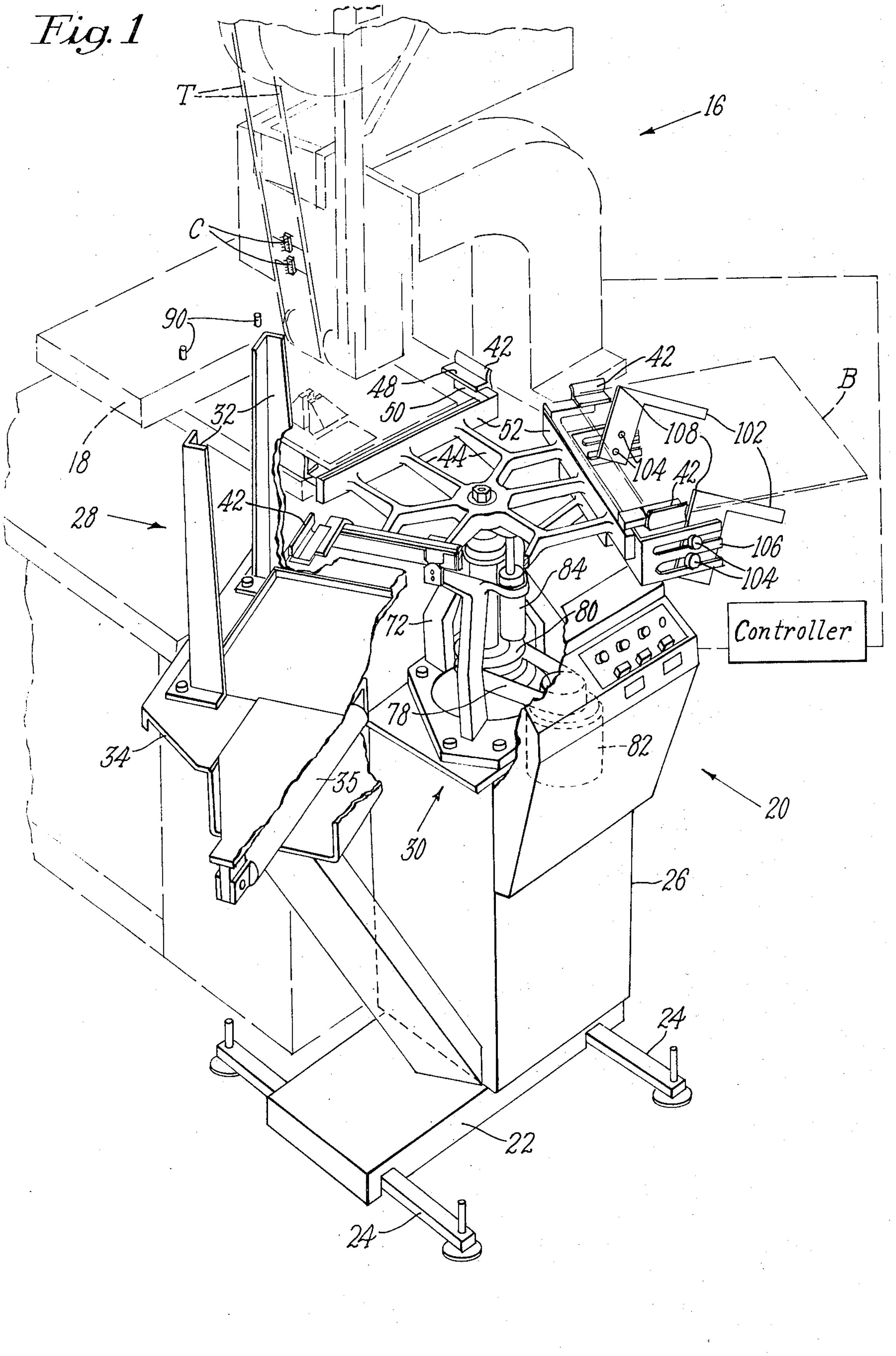
FIG. 1 is a perspective view, with portions broken away, showing the feeder arranged to deliver from a stack at a loading station successive circuit boards to be supplied to a component inserting station and then transferred to an unloading station whereat the boards may be delivered to a conveyor, bin or other means.

Referring to FIG. 1, it will be assumed for the sake of simple illustration that a component inserting machine generally designated 16, which may or may not be independently programmed as to location and/or type of component C to be delivered (for instance from tapes T, FIG. 1), cyclically mounts selected components in predetermined relation in the printed circuit of a substrate or circuit board generally designated B (FIGS. 1, 2, 7, 9–13). In order to serve the machine 16, herein assumed to be fitted with a programmable X-Y board supporting table 18, with successive boards B automatically at a rate synchronized with its capability, a free-standing board feeding machine generally designated 20 (FIG. 1) is suitable positioned adjacent to the work station occupied by the machine 16. Desirably a base 22 of the feeder is appropriately adjusted on slides 24, 24 for example. The board feeding machine 20 comprises a main frame 26 on which is disposed a loading station 28 next to be described for supporting a stack of the boards B, and a carousel type mechanism 30 subsequently explained.

The stations 28 (FIGS. 1, 2 and 5) comprises a stationary magazine for a vertically slidable stack of the boards B, the magazine being defined by four corner angle bars 32 mounted on a horizontal fixed platform 34 secured on the frame 26. The arrangement is such that the single lowest board B resting on the platform may be slidably ejected from beneath the retained stack and a lower portion of the pair of bars 32 nearest the mechanism 30. For cyclically effecting this ejection in time relation to rotation of the board feeding mechanism 30, a fluid pressure operated cylinder 35 (FIGS. 1 and 2) secured at one end to the platform 34 has a piston rod 36 (FIG. 2) connected to an S-shaped pusher member 38 that is slidably guided by a rod 40 fixedly mounted parallel to and beneath the platform 34. As indicated in dash lines in FIG. 2, the pusher travel to the right is to a fixed position sufficient to locate the displaced board B predeterminedly between a cooperative pair of board receiving grippers 42, 42 then in their lower, open position.

Figures 2, 3, 4:
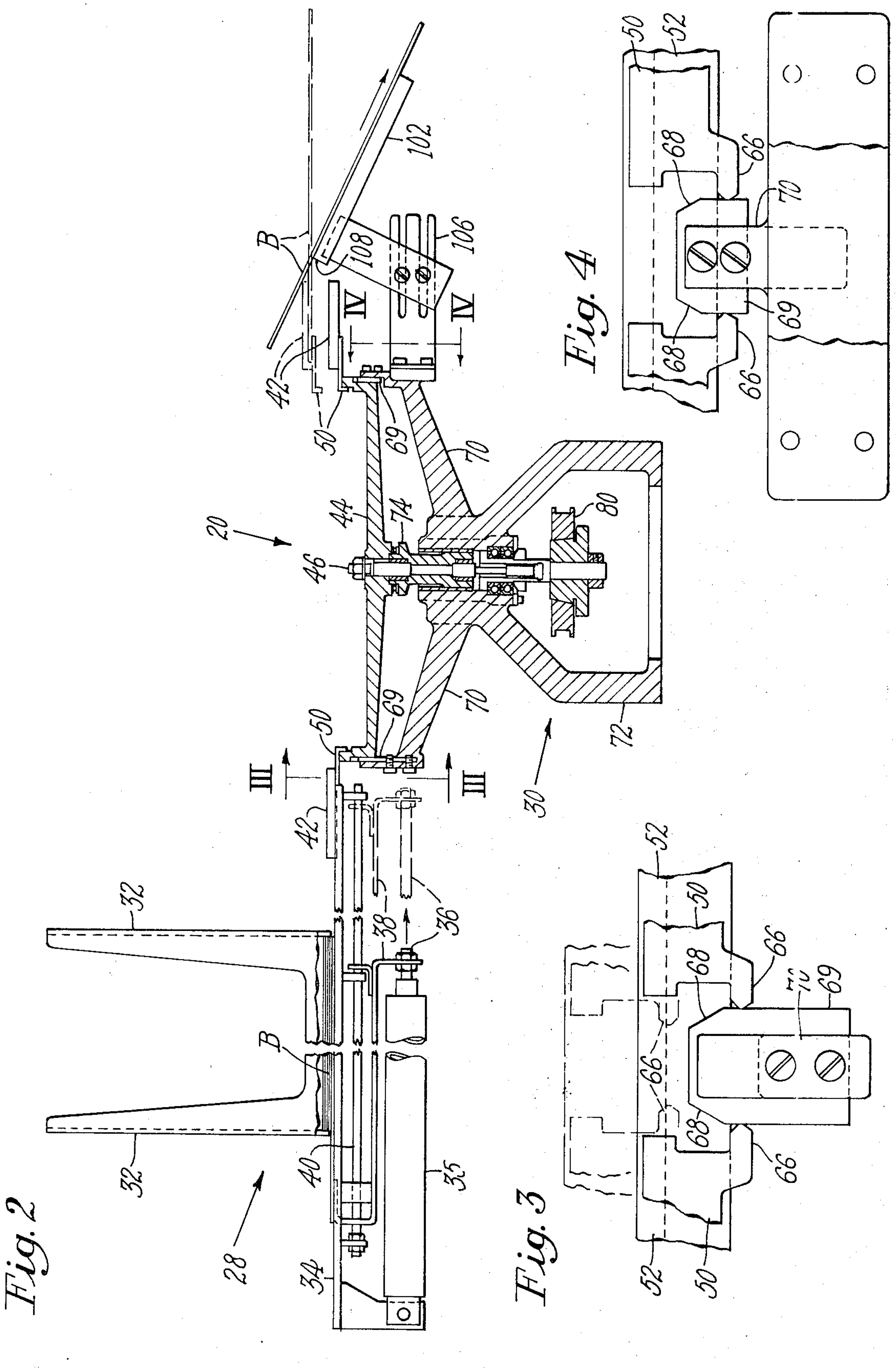
FIG. 2 is a largely sectional view taken in two vertical planes angularly related, of the board loading and unloading stations, the feed mechanism including a rotary work holder or spider serving the stations.
FIG. 3 is a view taken on the line III—III of FIG. 2 showing cam means controlling board loading of the feeder.
FIG. 4 is a section taken on the line IV—IV of FIG. 2 showing cam means controlling board unloading of the feeder.
Figures 5, 6:
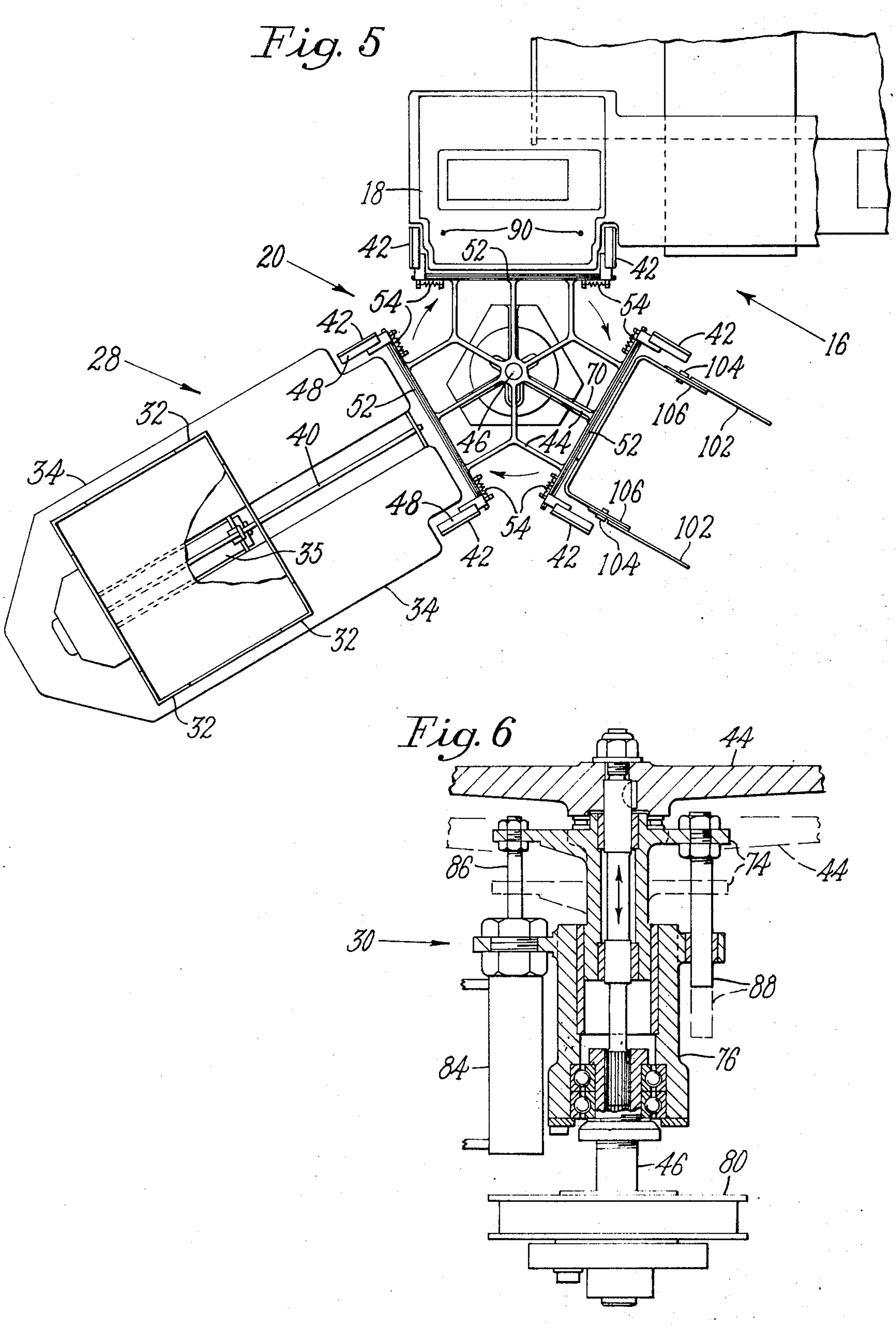
FIG. 5 is a plan view of the feeder and the stations served thereby, work gripping means of the feeder being shown empty.
FIG. 6 is an axial vertical section of a portion of the drive mechanism of the feeder.
Figures 7, 8, 9, 10:
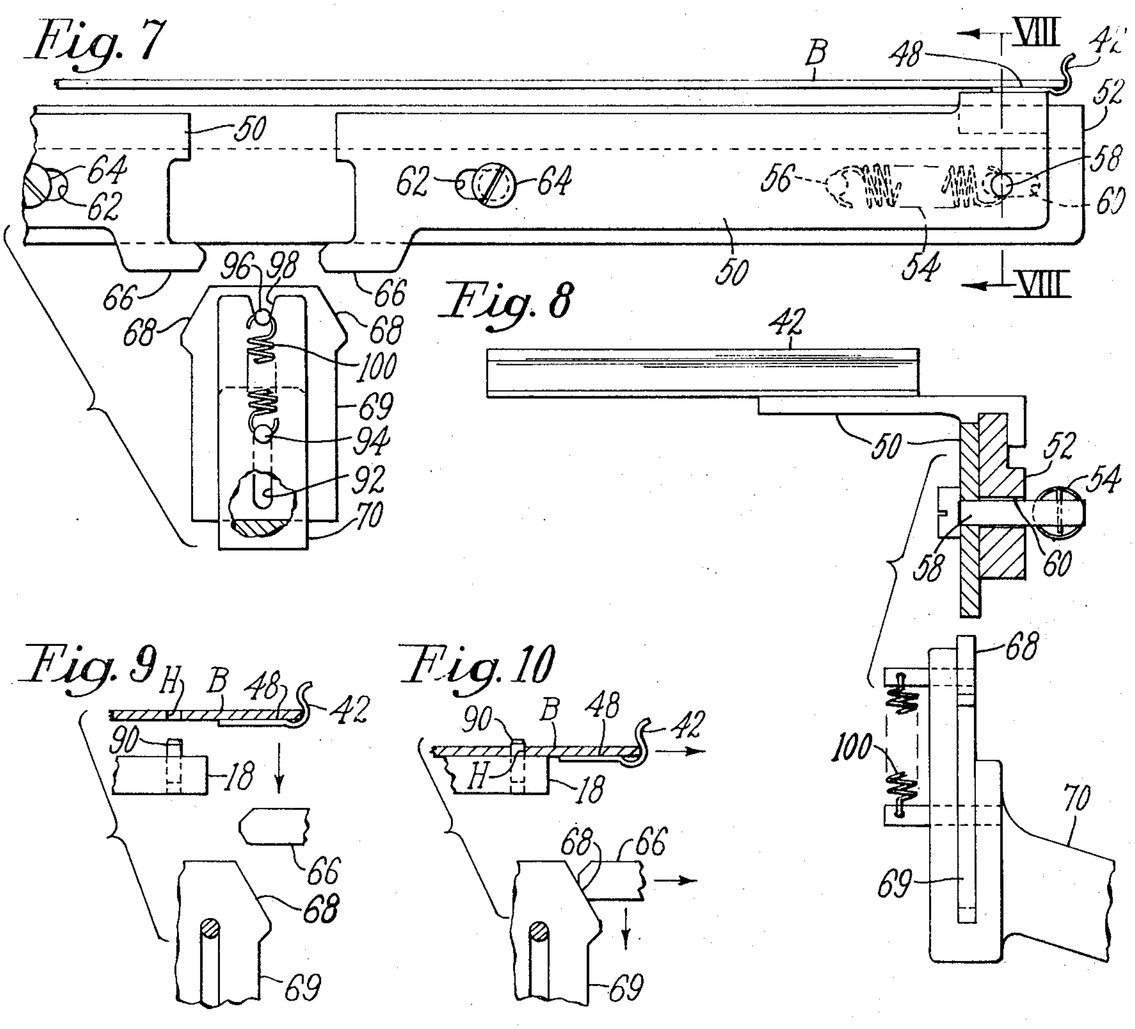
FIG. 7 is a view similar to FIGS. 3 and 4, but showing a portion of the spider at a work station, its board gripping means being in position to release and register a circuit board.
FIG. 8 is a section taken on the line VIII—VIII of FIG. 7, and FIGS. 9–13 sequentially illustrate the steps at the operating station for registering a circuit board and then regripping it for transfer.

As illustrated in FIGS. 2, 5, and 6, the board feeding mechanism 30 next to be described comprises a rotatable and vertically movable spider 44 keyed to a vertical spindle 46 for carrying a plurality of pairs of the grippers 42 circumferentially spaced to correspond with the number of stations, in this case three and hence 120° apart. The grippers 42 of each pair, as shown in FIG. 7, are respectively resilient and S-shaped in section to yieldingly retain a board B by snap action when its opposite edges are pressed relatively downward to deflect the grippers apart and seat the board on their opposite supporting surfaces 48, 48. As FIG. 8 shows, each gripper 42 is integral with an arm 50 laterally displaceable with respect to a guide plate 52 of the spider 44, the grippers of each pair respectively being yieldingly urged together by a spring 54 one end of which is connected to a pin 56 (FIG. 7) in the plate 52 and the other end of which is secured to a pin 58 anchored in the arm 50 and slidably extending in a lateral slot 60 (FIG. 8) of the plate 52. Another lateral slot 62 formed in the arm 50 receives a pin 64 anchored in the guide plate 52 to guide the grippers for limited relative lateral movement into and from closed or board gripping relation.

For controlling the grippers at the successive stations, inner ends 66 (FIGS. 3, 4, 7 and 9–13) of the gripper arms 50 are disposed to cooperate with portions 68, 68 of a cam 69 associated with radial arms 70 (FIGS. 2 and 4) respectively. These arms 70 project from a stationary drive housing 72 mounted in the frame 26. The spider 44 and its drive spindle 46, which is journalled in a sleeve 74 (FIG. 6) telescoped in a bearing support 76 of the housing 72, are rotated by a belt 78 and pulley 80 (FIGS. 1, 2 and 6), the belt being driven from a stepping motor or indexing drive 82 (FIG. 1). The latter and its braking mechanism (not shown) are intermittently energized to shift the grippers 42 from one station to the next clockwise.

At each station heightwise movement of the spider and its grippers simultaneously to control their close and opening by interaction of the arms 50 with the drive housing cams 68 is effected by a two-way fluid pressure operated cylinder 84 (FIGS. 1 and 6), its piston rod 86 being coupled to the sleeve 74, and the cylinder 84 being secured to the bearing support 76. For aiding in vertical guidance of the sleeve, rod 88 affixed thereto is slidable in a vertical bore formed in the support 76. Though not fully herein shown, it will be understood that controls for the vertical and rotating drive mechanism will usually receive their energization as a consequence of operating signals derived either from cycling of the machine 16 or from a computer or N/C controller at termination of a program for positioning the X-Y table 18.

Reverting to the board loading station 28, the spider 44 is in its down position and hence all grippers 42 are open when the cylinder 35 is energized to transfer a bottom board B into the empty loading station grippers 42. Next the cylinder 84 is energized to raise the spider 44 thereby allowing closure of the grippers 42 on the boards B to be indexed from the operating stations (Machine 16) and the loading station 28. Now the loaded spider is rotated clockwise as seen in FIGS. 1 and 5 by operation of the motor 82 and the belt 78 through an appropriate angle, in this instance about 120°, and braked to position a pair of preformed positioning holes H (one only shown in FIGS. 9–13) in the indexed board in vertical register with a pair of conical pins 90, 90 (FIGS. 5 and 9-13) secured in the X-Y table 18. The next step is for the cylinder 84 to re-lower the spider 44 and its arm ends 66 in its indexed position, the operating station parts being sequentially shown in FIGS. 7 and 9–13, thereby releasing and subsequently regaining the board B as will next be considered in detail.

Figure 11:
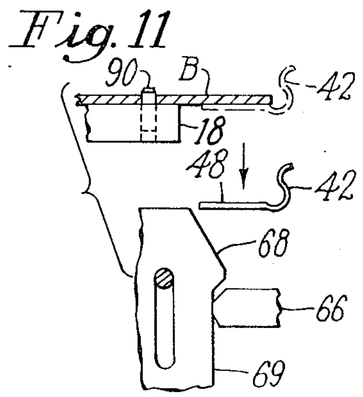
Figure 12:
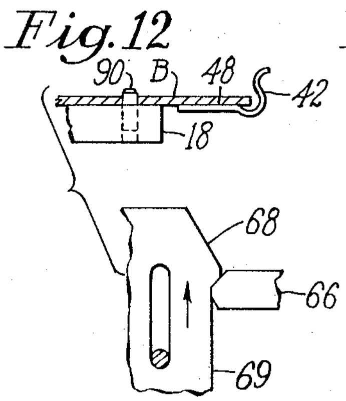
Figure 13:
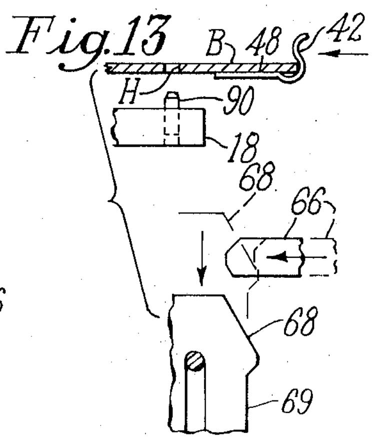

It is to be noted that in one important respect there preferably is a structural difference in the relation of the cam 69 with respect to the radial arm 70 at an operating station and at the loading station 28 or at the later-described unloading station. Specifically, as indicated in FIGS. 7 and 8 by contrast to FIGS. 2 and 3, the radial arm 70 at an operating station yieldingly supports heightwise the cam 69, whereas at the board loading and unloading stations the cams 69 are fixedly mounted and not displaceable vertically. Thus the arm 70 adjacent to the machine 16 is formed with a vertical slot 92 (FIGS. 7–13) slidably receiving a pin 94 projecting from the arm 70, and an upper pin 96 anchored in the arm 70 extends through a notch 98 in the upper end of the cam 69. A tension spring 100 interconnects the pins 94,96 to increasingly resist downward displacement of the cams 68 upon engagement therewith of the ends 66 when depositing a board B on the pins 90 in response to lowering of the spider 44 by the cylinder 84. The grippers 42, as shown in FIG. 10, accordingly are laterally cam separated to release the board after the locating holes of the lowered board B have yieldingly received the respective pins 90, and thereafter the grippers 42,42 are further lowered and, after the ends 66 have passed the widest divergence of the cams 68, are held separated in their release positions, as indicated in FIG. 11, by the ends 66 engaging the vertical sides of the cam 69. Component insertion by the machine 16 (or other operation) may now occur as programmed. At the end of this stage of the operating cycle the gripper supporting surfaces 48 are allowed, by reverse or upward action of the cylinder 84, to rise or engage the underside of the board B as shown in FIG. 12, the ends 66 again being cammed apart as they rise over the outer portion of the cam 68. The surfaces 48 lift the board off the locating pins 90 and, as the ends 66 rise as shown in FIG. 13, tce grippers re-close on the pin-free board to control it for clockwise indexing by the mechanism 30 to the next station by means of the motor 32.

Assuming the next station is the board unloading station, its operation will now be described with reference to FIGS. 1, 2, 4 and 5. The cylinder 84 is pressurized, when the closed grippers 42 have carried a processed board 120° into vertical register with an inclined chute 102 (FIG. 2), to lower the grippers 42 and thus effect release of the board. Preferably, the arrangement is such that the chute 102 consists of stationary spaced angular slide members adjustably secured respectively, by a pair of bolts 104,104 to a slotted extension 106 of an arm 70. Upper ends 108,108 of the slide members are so disposed that as the open grippers 42 descend they allow the board to be deposited in unbalanced condition on the inclined slide members, the board accordingly first pivotting clockwise on the ends 108, under the influence of gravity, and then descending to a conveyor or other receptacle not shown.

After each pair of grippers 42 has discharged its board at the unloading station, the mechanism 30 cycles the pair to the loading station 28 for repeat operations. It will be apparent from the foregoing that an operator need only insure that the loading station 28 is supplied with boards B and the inserting machine 16 is kept loaded with suitable components. The organization is such that relatively small floor space is required for the apparatus and a high output of precision assemblies may be produced in widely ranging form.

Having thus described our invention, what we claim as new and desire to secure by Letters Patent of the United States is:

1. A machine for simultaneously feeding printed circuit boards to and through successively operating stations comprising a work holder rotatable about an axis and carrying spaced pairs of yieldable board gripping means, mechanism for indexing the work holder about said axis, said pairs of gripping means being spaced to correspond with the spacing of the stations, and automatic mechanism for moving the work holder heightwise of the stations to cause the pairs of board grippers simultaneously to lock onto and to release the respective boards.

2. Apparatus for assembling electronic components on printed circuit boards comprising, in combination with a component inserting machine having a board supporting table and a cyclically operable head, a board feeding machine indexable about an axis in time relation to the cycling of said head once or a predetermined number of times, the feeding machine including a board loading station spaced from one side of the inserting machine and a board unloading machine spaced from the other side of the inserting machine, the feeding machine including a rotary work holder movable parallel to said axis and comprising spaced pairs of cooperative grippers, mechanism for moving the work holder parallel to said axis to control board gripping and releasing movement of the grippers of each pair, and means for indexing the work holder about the axis to cause the respective pairs of grippers successively to receive and grip a board from the loading station, predeterminedly release the board to the inserting machine table, recover the released board after component inserting operation of said head, and thereafter deliver the board for release to the unloading station.

3. Apparatus as in claim 2 wherein the rotary work holder includes a multi-armed spider supporting the pairs of grippers with spacing corresponding to the angular spacing of the stations about the axis, each pair of grippers being yieldable laterally to open and close on opposite margins of the boards, cam means disposed at the respective stations for controlling gripper closing and opening movements, and a pair of board positioning pins associated with the inserting machine table, the cam means at the inserting machine station being yieldable heightwise to enable positioning holes of each board yieldingly to receive said pair of board positioning pins.

4. Apparatus as in claim 2 wherein the arrangement is such that the respective pairs of grippers are in open, board receivable position when the work holder is lowered along said axis relative to the respective stations, a magazine at said loading station is adapted for bottom feeding of successive boards therefrom, and a pusher member is actuated in time relation to the operating cycle of the inserting machine for transferring a bottom board from the magazine into predetermined position in an adjacent, open pair of said grippers.

5. Apparatus as set forth in claim 2 wherein the unloading station comprises an inclined chute, upper opposed side portions of which are disposed to be engaged by a board as it is released in the course of downward movement of the work holder along its said axis, the arrangement being such that the board when thus engaged is in unbalanced condition and hence tiltable for discharge by gravity from the chute and away from the feeding machine.

6. Apparatus as in claim 2 wherein the board supporting table is programmable in X-Y coordinates, and the board feeding machine is indexable automatically at termination of each program by a controller.

* * * * *